US012630051B2

(12) United States Patent
    Kang

(10) Patent No.: US 12,630,051 B2
(45) Date of Patent: May 19, 2026

(54) VEHICLE BATTERY DIAGNOSIS METHOD AND SYSTEM

(71) Applicants: HYUNDAI MOTOR COMPANY, Seoul (KR); KIA CORPORATION, Seoul (KR)

(72) Inventor: Chun Yong Kang, Yongin-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 735 days.

(21) Appl. No.: 17/700,140

(22) Filed: Mar. 21, 2022

(65) Prior Publication Data

US 2023/0009288 A1    Jan. 12, 2023

(30) Foreign Application Priority Data

Jul. 9, 2021    (KR) ......................... 10-2021-0090345

(51) Int. Cl.
| | |
|---|---|
| *H02J 7/00* | (2026.01) |
| *B60L 58/12* | (2019.01) |
| *B60L 58/16* | (2019.01) |
| *B60L 58/25* | (2019.01) |
| *G01R 31/367* | (2019.01) |
| *G01R 31/374* | (2019.01) |
| *G01R 31/3835* | (2019.01) |
| *G01R 31/392* | (2019.01) |
| *H02J 7/82* | (2026.01) |
| *H02J 7/84* | (2026.01) |
| *H02J 7/96* | (2026.01) |

(52) U.S. Cl.
    CPC ............... *B60L 58/16* (2019.02); *B60L 58/12* (2019.02); *B60L 58/25* (2019.02); *G01R 31/367* (2019.01); *G01R 31/374* (2019.01); *G01R 31/3835* (2019.01); *G01R 31/392* (2019.01); *H02J 7/82* (2026.01); *H02J 7/84* (2026.01); *H02J 7/96* (2026.01)

(58) Field of Classification Search
    USPC ........................................................ 320/132
    See application file for complete search history.

(56) References Cited

U.S. PATENT DOCUMENTS

| | | |
|---|---|---|
| 8,890,480 B2 | 11/2014 | Vian et al. |
| 10,684,329 B2 | 6/2020 | Gajewski et al. |

(Continued)

FOREIGN PATENT DOCUMENTS

| | | |
|---|---|---|
| JP | 2010-0261807 A | 11/2010 |
| JP | 2013-148458 A | 8/2013 |

(Continued)

OTHER PUBLICATIONS

Machine Translation of CN17700140 (Year: 2018).*

*Primary Examiner* — Samuel Berhanu
(74) *Attorney, Agent, or Firm* — MCDONNELL BOEHNEN HULBERT & BERGHOFF LLP

(57) ABSTRACT

A vehicle battery diagnosis method and system are provided. A controller completes charging a battery by stopping supply of current from a charger to the battery. The controller measures a relaxation voltage corresponding to a decrement of a voltage of the battery during a predetermined time period directly after the charging of the battery is completed. The controller estimates the state of health (SoH) of the battery in accordance with the relaxation voltage.

17 Claims, 6 Drawing Sheets

*131*

| | | SOC (%) | | | | | |
|---|---|---|---|---|---|---|---|
| | | 5 | 10 | 30 | 50 | 70 | 95 |
| Temp. | 45℃ | | | | | | |
| | 30℃ | | | | | | |
| | 15℃ | | | Constant Current Charging Time | | | |
| | 0℃ | | | | | | |
| | −15℃ | | | | | | |

*133*

| LiB inside Temp. @YY ℃ | | −Relaxing voltage (△ V/%) | | | | | |
|---|---|---|---|---|---|---|---|
| | | 5 | 10 | 20 | 30 | 40 | 50 |
| CC→CV Time Taken to Conversion | 3hr | | | | | | |
| | 3.25hrs | | | | | | |
| | 3.5Hrs | | Estimated SoH (Lifetime) Value | | | | |
| | 3.75hrs | | | | | | |
| | 4hrs | | | | | | |

(56) References Cited

U.S. PATENT DOCUMENTS

| | | | | |
|---|---|---|---|---|
| 2002/0167294 A1* | 11/2002 | Odaohhara | ........... | H02J 7/0031 |
| | | | | 320/132 |
| 2009/0108804 A1* | 4/2009 | Aradachi | ................ | H02J 7/007 |
| | | | | 320/106 |
| 2013/0066573 A1* | 3/2013 | Bond | ................... | G01R 31/392 |
| | | | | 324/426 |
| 2014/0077815 A1* | 3/2014 | Mattisson | .......... | G01R 19/0069 |
| | | | | 324/426 |
| 2022/0069590 A1* | 3/2022 | Miyaji | ............. | H02J 7/007188 |

FOREIGN PATENT DOCUMENTS

| | | | |
|---|---|---|---|
| KR | 10-2013-0064308 A | 6/2013 |
| KR | 10-2015-0022345 A | 3/2015 |
| WO | 2019097357 A1 | 5/2019 |

* cited by examiner

| | | SOC (%) | | | | | |
|---|---|---|---|---|---|---|---|
| | | 5 | 10 | 30 | 50 | 70 | 95 |
| Temp. | 45℃ | | | | | | |
| | 30℃ | | | | | | |
| | 15℃ | | Constant Current Charging Time | | | | |
| | 0℃ | | | | | | |
| | −15℃ | | | | | | |

_400_

_133_

| LIB inside Temp. @YY ℃ | | ~Relaxing voltage (△ V/%) | | | | | |
|---|---|---|---|---|---|---|---|
| | | 5 | 10 | 20 | 30 | 40 | 50 |
| CC→CV Time Taken to Conversion | 3hr | | | | | | |
| | 3.25hrs | | | | | | |
| | 3.5Hrs | | Estimated SoH (Lifetime) Value | | | | |
| | 3.75hrs | | | | | | |
| | 4hrs | | | | | | |

600

700

VEHICLE BATTERY DIAGNOSIS METHOD AND SYSTEM

CROSS REFERENCE TO RELATED APPLICATION

The present application claims priority to Korean Patent Application No. 10-2021-0090345, filed Jul. 9, 2021, the entire contents of which is incorporated herein for all purposes by this reference.

BACKGROUND

Field

The present disclosure generally relates to a vehicle battery diagnosis method and system and, more particularly, to a vehicle battery diagnosis method and system able to measure the relaxation voltage of a battery after the operation of charging the battery with a static voltage is completed, thereby estimating the state of health (SoH) and the lifetime of the battery.

Description of Related Art

Batteries creating an electrochemical reaction gradually degrade due to irreversible reactions occurring therein as the batteries are used over time. The degradations of a battery may occur in the form of reduced output performance, reduced capacity, and the like, thereby disadvantageously reducing the acceleration performance or the fuel efficiency of the vehicle using the battery.

Accordingly, when the state of health (SoH) of a battery used in a vehicle can be accurately estimated, it is possible to accurately estimate the traveling performance and the fuel efficiency of the vehicle. It is also possible to apply a diagnosis function depending on the state of the battery or to provide information regarding a battery replacement period, thereby improving driver convenience.

Many vehicle battery diagnosis methods estimate the SoH or the lifetime of a battery by establishing an electrochemical battery degradation model and applying battery-related measurement data to the battery degradation model.

However, such vehicle battery diagnosis methods of the related art may have problems in that, for example, the lifetime or the SoH of a battery has low accuracy depending on the established battery degradation model or the type of measured data or an extended time or high accuracy is required for the measurement of data.

The foregoing is intended merely to aid in the understanding of the background of the present disclosure, and is not intended to mean that the present disclosure falls within the purview of the related art that is already known to those skilled in the art.

SUMMARY

Accordingly, the present disclosure proposes a vehicle battery diagnosis method and system able to measure the relaxation voltage of a vehicle battery after the charging of the battery is completed and accurately measure the state of health (SoH) of the battery without limitations in time or space on the basis of the measured relaxation voltage.

In order to achieve the above objective, according to one aspect of the present disclosure, there is provided a vehicle battery diagnosis method including: completing, by a controller, charging a battery by stopping supply of current from a charger to the battery, measuring, by the controller, a relaxation voltage corresponding to a decrement of a voltage of the battery during a predetermined time period directly after the charging of the battery is completed, and estimating, by the controller, a state of health (SoH) of the battery in accordance with the relaxation voltage.

The charger may operate in a constant current charging mode in which the charger charges the battery by supplying a charging current having a predetermined magnitude to the battery and in a constant voltage charging mode in which the charger charges the battery by applying a charging voltage having a predetermined magnitude to the battery when the voltage of the battery reaches a predetermined reference value in the constant current charging mode.

The method may further include, before the completion of the charging, determining, by the controller, whether or not the battery malfunctions in accordance with a time section in which the constant current charging mode is activated.

In the determination of whether or not the battery malfunctions, the battery may be determined as malfunctioning when a difference between a reference constant current charging time corresponding to a temperature and a state of charge of the battery and a time section in which the constant current charging mode is activated is out of a predetermined range.

The determination of whether or not the battery malfunctions may include determining a reference constant current time corresponding to an actually-measured temperature of the battery and a state of charge of the battery from a constant current charging time table in which a reference constant current charging time is set in advance to correspond to a temperature of the battery and the state of charge of the battery, and when a difference between the reference constant current time and a time in which the constant current charging mode is activated is out of a predetermined range, determining the battery as malfunctioning.

The constant current charging time table may comprise a plurality of constant current charging time tables according to the SoH of the battery.

In the estimation of the SoH of the battery, the SoH of the battery may be estimated in accordance with a time section in which the constant current charging mode is activated and the relaxation voltage.

In the estimation of the SoH of the battery, the SoH may be determined by applying an actually-measured time section in which the constant current charging mode is activated and the actually-measured relaxation voltage to an SoH table in which a time section in which the constant current charging mode is activated and an estimated SoH value corresponding to the relaxation voltage are set in advance.

The SoH table may be a plurality of SoH tables according to the temperature of the battery.

In the SoH table, the estimated SoH value may be determined by linearly dividing a section between the relaxation voltage measured from a fresh sample of the battery and the relaxation voltage measured from an end-of-life (EOL) sample of the battery.

The EOL sample may be a $90^{th}$ percentile battery selected from a group of samples including a plurality of EOL batteries.

In order to achieve the above objective, according to another aspect of the present disclosure, there is provided a vehicle battery diagnosis system operating in a constant current charging mode to supply a charging current having a predetermined magnitude to a battery of a vehicle and in a constant voltage charging mode to provide a charging voltage having a predetermined magnitude to the battery when a voltage of the battery in the constant current charging mode reaches a predetermined reference value. The system may include a memory including a constant current charging time table in which a reference constant current charging time corresponding to a temperature of the battery and a state of charge of the battery are set in advance and a state of health (SoH) table in which an estimated SoH value corresponding to a time section in which the constant current charging mode is activated and the relaxation voltage are set in advance, and a processor completing charging of the battery by stopping supply of current from a charger to the battery, measuring a relaxation voltage corresponding to a decrement of the voltage of the battery during a predetermined time period directly after the charging of the battery is completed, and diagnosing the battery by applying the temperature of the battery, the state of charge of the battery, the time section in which the constant current charging mode is activated, and the relaxation voltage to the constant current charging time table and the SoH table.

The processor may determine a reference constant current time corresponding to the actually-measured temperature of the battery and the state of charge of the battery from the constant current charging time table and, when a difference between the determined reference constant current time and a time in which the constant current charging mode is activated is out of a predetermined range, determines the battery as malfunctioning.

The constant current charging time table may be a plurality of constant current charging time tables according to the SoH of the battery.

The processor may determine the SoH of the battery by applying an actually-measured time section in which the constant current charging mode is activated and the actually-measured relaxation voltage to the SoH table.

The SoH table may be a plurality of SoH tables according to the temperature of the battery.

The estimated SoH value may be determined by linearly dividing a section between the relaxation voltage measured from a fresh sample of the battery and the relaxation voltage measured from an end-of-life (EOL) sample of the battery.

The EOL sample may be a $90^{th}$ percentile battery selected from a group of samples including a plurality of EOL batteries.

According to the vehicle battery diagnosis method and system, it is possible to accurately diagnose the SoH (or lifetime) of a battery or whether or not the battery malfunctions by measuring the relaxation voltage of the battery directly after the charging of the battery is completed.

Consequently, according to the vehicle battery diagnosis method and system, it is possible to provide a customer or a manufacturer with accurate information regarding the customer service time or the possibility of a serious safety problem of the vehicle battery in order to remove or reduce customer inconvenience and prevent an accident.

The effects of the present disclosure are not limited to the aforementioned description, and other effects of the present disclosure not explicitly described will be clearly understood from the description provided hereinafter by those skilled in the technical field, to which the present disclosure pertains.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 3 is a diagram illustrating an example constant current charging time table used in the vehicle battery diagnosis system and method according to an embodiment of the present disclosure;

DETAILED DESCRIPTION

Hereinafter, a vehicle battery diagnosis method and system according to various embodiments of the present disclosure will be described in more detail with reference to the accompanying drawings.

Figure 1:
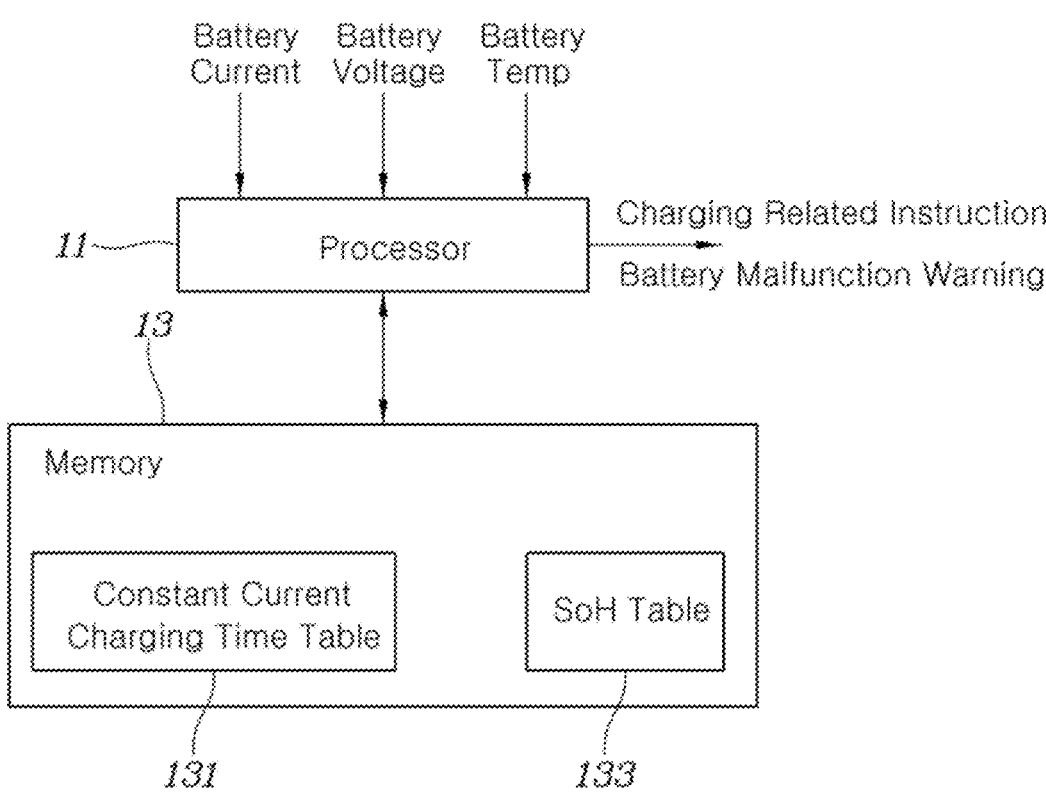
FIG. 1 is a block diagram illustrating a vehicle battery diagnosis system according to an embodiment of the present disclosure.

FIG. 1 is a block diagram illustrating a vehicle battery diagnosis system according to an embodiment of the present disclosure. The vehicle battery diagnosis system according to an embodiment of the present disclosure may have a configuration such as that illustrated in FIG. 1.

Referring to FIG. 1, the vehicle battery diagnosis system according to an embodiment of the present disclosure may be implemented as a controller including a processor 11 and a memory 13. The processor 11 collects data required for diagnosing a vehicle battery, performs determination, and outputs instructions regarding the operation of other components. The memory 13 stores various data and tables 131 and 133 to diagnose the vehicle battery.

For example, the vehicle battery diagnosis system according to an embodiment of the present disclosure may be implemented as a battery management system (BMS) configured to manage and control a battery in a vehicle.

The processor 11 is a component collecting data to diagnose the vehicle battery, perform determination, and output instructions regarding the operation of other components.

For example, the processor 11 may collect battery-related data, such as a battery current, a battery voltage, and a battery temperature, necessary for diagnosing the vehicle battery. The battery current, the battery voltage, the battery temperature, and the like may be detected by a plurality of sensors (not shown) disposed on the battery. The processor 11 may collect the data detected by the sensors.

In addition, the processor 11 may send instructions, such as a charge start instruction and a charge complete instruction, to a charger provided within the vehicle or charging equipment provided outside the vehicle. The processor 11 may also provide set values regarding the magnitude of charging current and the magnitude of a charging voltage to the charger or the charging equipment.

For example, in a situation in which the battery voltage is low, the processor 11 may provide the charging current to the charger or the charging equipment by setting the magnitude of the charging current so that the battery is charged with a constant current. When the battery voltage reaches a predetermined value, the processor 11 may provide a charging voltage to the charger or the charging equipment by setting the magnitude of the charging voltage so that the battery is charged with a voltage of a constant magnitude.

In addition, the processor 11 may determine a battery diagnosis result by applying the battery-related data collected in a specific situation to a table stored in the application memory 13.

In an example, the processor 11 may determine whether or not the battery malfunctions on the basis of the difference in the voltage between battery cells of the battery.

In another example, when the battery is charged in a constant current and constant voltage mode, whether or not the battery malfunctions may be determined on the basis of the time used for constant current charging.

In another example, the processor 11 may review a battery relaxation voltage after the charging of the battery is completed and estimate the state of health (SoH) and the lifetime of the battery on the basis of the battery relation voltage and a constant current charge time.

When estimating the SoH and the lifetime of the battery on the basis of the constant current charge time, the processor 11 may use a plurality of tables stored in the memory 13.

The memory 13 is a component storing a plurality of tables necessary for the estimation of the SoH of the vehicle battery. The memory 13 may store a plurality of tables 131 and 133, storing information input from the processor 11 or storing values required for the estimation of the SoH of the vehicle battery.

The tables stored in the memory 13 may include a constant current charging time table 131 storing constant current charging times according to the SoH of the battery on the basis of the state of charge of the battery and the battery temperature.

In addition, the tables stored in the memory 13 may include an SoH table 133 storing the SoH of the battery on the basis of the relaxation voltage of the battery and the constant current charging time of the battery.

The tables 131 and 133 stored in the memory 13 may be previously prepared by deriving necessary data in advance in an experimental manner.

The constant current charging time table 131 may be a table in which the constant current charging times according to the state of charge of the battery and the temperature of the battery are derived and stored in advance according to the SoH of the battery in the constant current-constant voltage charging mode. That is, the constant current charging time table 131 may be prepared by preparing standard sample batteries, each representative of a corresponding SoH and actually measuring the constant current charging times of the standard sample batteries, respectively, while varying the state of charge and the temperature of the batteries.

Figure 2:
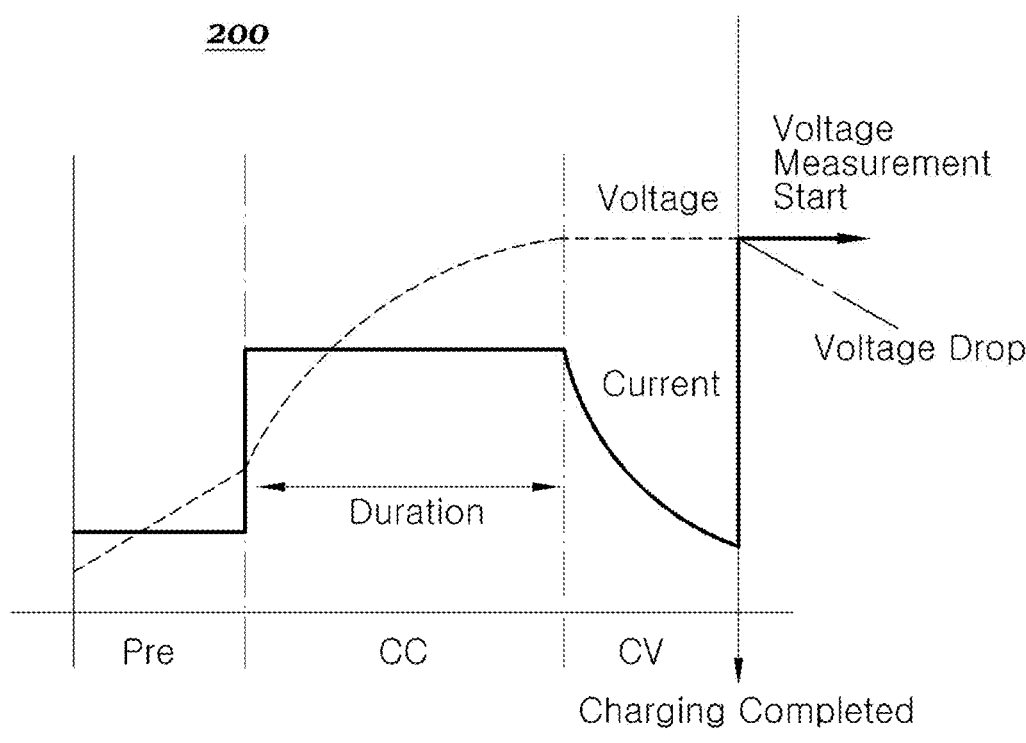
FIG. 2 is a graph illustrating the relationship between the charging voltage and the charging current in a typical constant current-constant voltage charging mode.

FIG. 2 is a graph illustrating the relationship between the charging voltage and the charging current in a typical constant current-constant voltage charging mode. In FIG. 2, the horizontal axis indicates the time, whereas the vertical axis indicates the voltage and the current. In addition, the symbol "Pre" indicates a pre-charging section, "CC" indicates a constant current charging section, and "CV" indicates a constant voltage charging section.

As illustrated in the graph 200 in FIG. 2, which plots the voltage over time, the constant current-constant voltage charging mode is a well-known charging mode generally used in charging lithium (Li) ion batteries. When the battery voltage is smaller than a predetermined reference value, the battery is charged by supplying a constant voltage having a predetermined magnitude to the battery from the charger. As the constant current charging progresses, the state of charge of the battery increases together with the battery voltage. When the battery voltage reaches the predetermined reference value, the battery is charged by applying a charging voltage having a predetermined magnitude to the battery from the charger.

When the constant current-constant voltage charging mode is used, a time section in which the constant current charging is performed may vary depending on the state of charge and the temperature of the battery and may be influenced by the SoH of the battery.

In an embodiment of the present disclosure, the constant current charging time table 131 may be prepared in advance by preparing standard batteries according to the SoH and measuring the constant current charging times according to the state of charge and the temperature of the batteries, and then, may be stored in the memory 13.

FIG. 3 is a diagram illustrating an example constant current charging time table used in the vehicle battery diagnosis system and method according to an embodiment of the present disclosure.

As illustrated in FIG. 3, the constant current charging time table 131 includes the states of charge of the battery (on the horizontal axis) and the temperatures of the battery (on the vertical axis) as reference parameters. The constant current charging times of the battery according to the state of charge and the temperature may be stored in advance. Since the constant current charging times of the battery are also influenced by the SoH of the battery, a plurality of constant current charging time tables according to the SoH of the battery may also be provided.

When the vehicle battery is actually charged, the processor 11 may determine whether or not the battery malfunctions by comparing an actual constant current charging time with the constant current charging times stored in the constant current charging time table 131, on the basis of the state of charge and the temperature of the battery, at the start of the charging of the battery.

For example, when the constant current charging time measured in actual charging of the battery is greater or smaller by a predetermined amount than the previously-stored constant current charging time searched in the constant current charging time table 131, the processor 11 may determine the battery as malfunctioning.

The SoH table 133 is a table prepared in advance using the relationship between the relaxation voltage and the SoH of the battery after the charging of the battery is completed, i.e., the supply of the charging current to the battery is terminated. Here, the relaxation voltage corresponds to the decrement of the voltage of the battery reduced during a predetermined time period (e.g., tens of minutes).

Figures 4, 5:
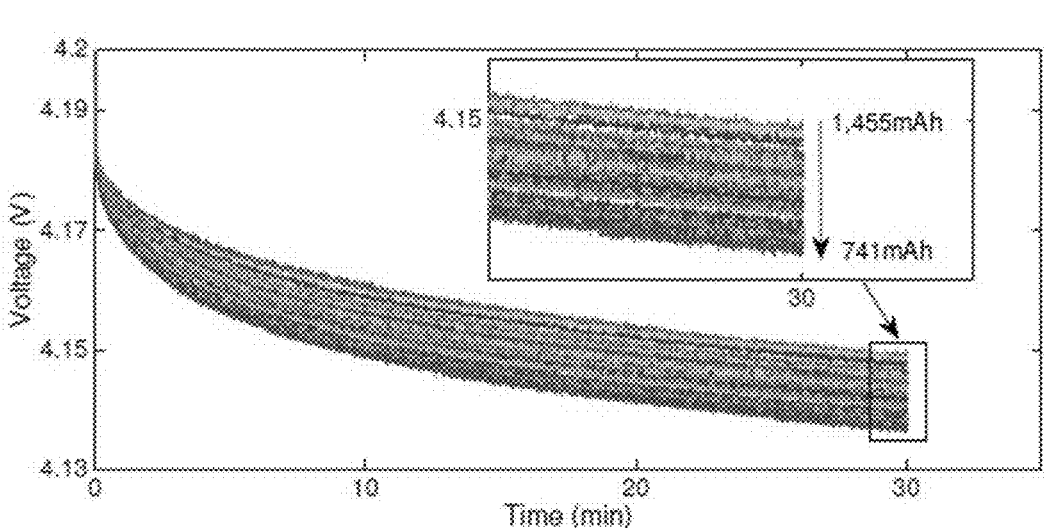
FIG. 4 is a graph illustrating characteristics of a typical battery relaxation voltage.
FIG. 5 is a diagram illustrating an example SoH table used in the vehicle battery diagnosis system and method according to an embodiment of the present disclosure.

FIG. 4 is a graph 400 illustrating characteristics of a typical battery relaxation voltage, plotting voltage over time.

As illustrated in FIGS. 2 and 4, from a time point at which the charging is completed and the charging current provided to the battery is 0 (i.e., a "charging complete" time point in FIG. 2 and a time point corresponding to "0" in FIG. 3), the voltage of the battery continuously decreases for a predetermined time. The voltage decreasing in this manner is referred to as the relaxation voltage.

The relaxation voltage is generated as the voltage of the battery drops close to an open circuit voltage (OCV) directly after the charging of the battery is completed. The relaxation voltage is greater when the battery has a greater internal resistance. That is, since the internal resistance of the battery increases along with the degradation of the battery, the more degraded the battery is, the greater the relaxation voltage is.

In an embodiment of the present disclosure, the SoH table 133 may be prepared by actually measuring in advance the SoH of each of the batteries according to the constant current charging time of the battery during charging and the magnitude of the relaxation voltage of the battery in an experimental manner.

As described above, the constant current charging time and the SoH of the battery may have high correlation. This is because, when the battery has a higher internal resistance with degradations thereof, the battery may have a higher voltage at less current. Thus, the SoH table 133 may be prepared by also considering the relaxation voltage and the constant current charging time of the battery.

FIG. 5 is a diagram illustrating an example SoH table used in the vehicle battery diagnosis system and method according to an embodiment of the present disclosure.

As illustrated in FIG. 5, the SoH table 133 includes the relaxation voltages of the battery (on the horizontal axis) and the constant current charging times of the battery (on the vertical axis) as reference parameters. The SoH (i.e., the lifetime) of the battery according to the relaxation voltage and the constant current charging time of the battery may be stored in advance. Since the constant current charging times of the battery are also influenced by the temperatures of the battery, a plurality of SoH tables according to the battery temperature may be provided.

When actual charging of the vehicle battery is completed, the processor 11 may measure the relaxation voltage, i.e., the decrement of the battery voltage reduced during a predetermined time period and apply the measured relaxation voltage and the constant current charging time to the SoH table 133. In this manner, the processor 11 may estimate the SoH of the battery corresponding to the relaxation voltage and the constant current charging time to be the actual SoH of the battery.

In addition, when preparing the SoH table 133, a battery sample used may be a fresh battery sample that has been charged and discharged a very small number of times and an end-of-life (EOL) battery sample. An estimated value of the SoH of the SoH table 133 may be determined by measuring the relaxation voltages of the fresh battery sample and the EOL battery sample and linearly dividing a section between the two measured relaxation voltages. For example, when the relaxation voltage of the fresh battery sample is 0.2 V and the relaxation voltage of the EOL battery sample is 0.4 V, the SoH table 133 may be prepared by linearly dividing the section between the two relaxation voltages and determining the SoH or the lifetime to be 50% in which the relaxation voltage corresponds to 0.3 V.

Here, the EOL battery sample may be a battery selected from EOL batteries collected from the field, the percentile of the selected battery being about $90^{th}$ percentile with respect to the SoH. In other words, in a case in which 100 EOL batteries are collected, the performance of the battery sample used in preparing the SoH table 133 may be the $90^{th}$ percentile, i.e., the battery sample used in preparing the SoH table 133 is in the $90^{th}$ percentile for SoH.

Figure 6:
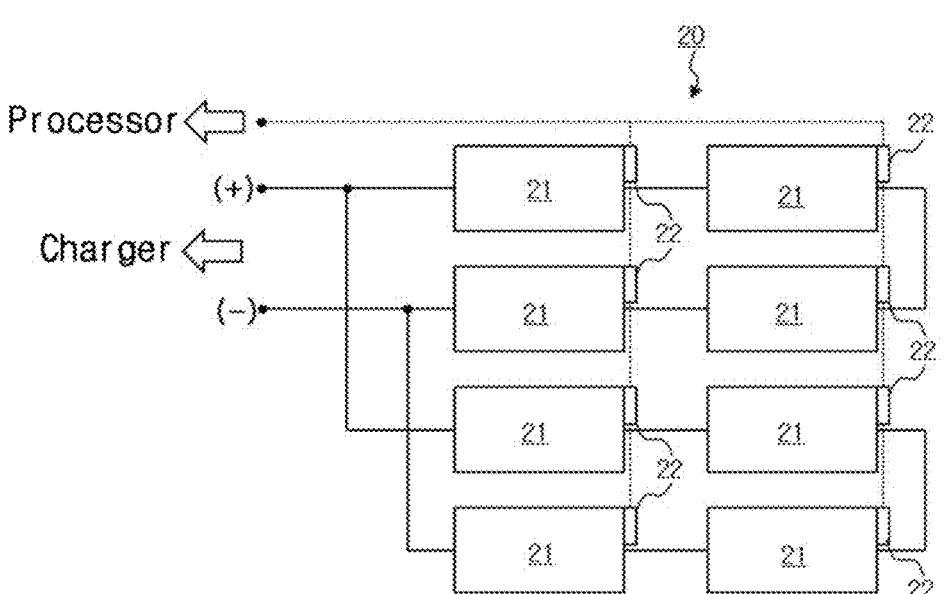
FIG. 6 is a diagram schematically illustrating the structure of a typical battery.

FIG. 6 is a diagram 600 schematically illustrating the structure of a typical battery.

As illustrated in FIG. 6, a battery 20 used for driving a vehicle may be fabricated as a battery pack including a plurality of battery modules 21. Each of the battery modules 21 may include at least one battery cell (not shown) having a unit voltage. A voltage sensor 22 may be provided on each of the battery modules 21 to monitor the voltage of the battery module 21. The battery modules 21 may be electrically connected to each other in series, in parallel, or in a structure in which series and parallel connections are combined as required within the battery pack, thereby forming the overall voltage of the battery pack.

The processor 11 may receive the voltages of the battery modules 21 through the voltage sensors 22, and may diagnose the battery modules 21 regarding the malfunction or the SoH (or lifetime) of each of the battery modules 21 as described above. The vehicle battery pack is configured such that the battery modules 21 are electrically connected to form the overall voltage of the battery pack. Thus, when at least one of the battery modules 21 in the battery pack malfunctions or has a high SoH, the overall performance of the battery may also be influenced.

In an embodiment of the present disclosure, after the charging of the battery is completed and the supply of the charging current to the battery is terminated, the relaxation voltage of the battery is measured during a predetermined time period. When the discharging of the battery is required for traveling of the vehicle before the passage of the predetermined time period, the relaxation voltage of at least one predetermined battery module may be measured.

That is, when the relaxation voltage may be measured without traveling of the vehicle for a predetermined time period after the charging of the vehicle, the relaxation voltages of all of the battery modules 21 in the battery pack 20 may be measured, thereby performing diagnosis on all the battery modules 21. When the traveling of the vehicle is required before the passage of the predetermined time period after the charging of the vehicle, the relaxation voltage of at least one predetermined battery module may be measured, and thus, diagnosis may only be performed on the battery module, the relaxation voltage of which is measured.

The predetermined battery modules, the relaxation voltages of which are measured when the measurement of the relaxation voltage cannot be performed on all the battery modules, may be determined considering a diagnosis history, such as a previously-performed diagnosis of malfunction, output power required for the driving of the vehicle, and the like. For example, when a battery cell is determined to have a higher SoH than the other battery modules in the previous diagnosis of malfunction, this battery cell may be determined to be a battery cell, the relaxation voltage of which is to be measured. In addition, when the required output power of the vehicle is low, the number of battery cells, the relaxation voltage of which is to be measured, may be relatively increased.

Figure 7:
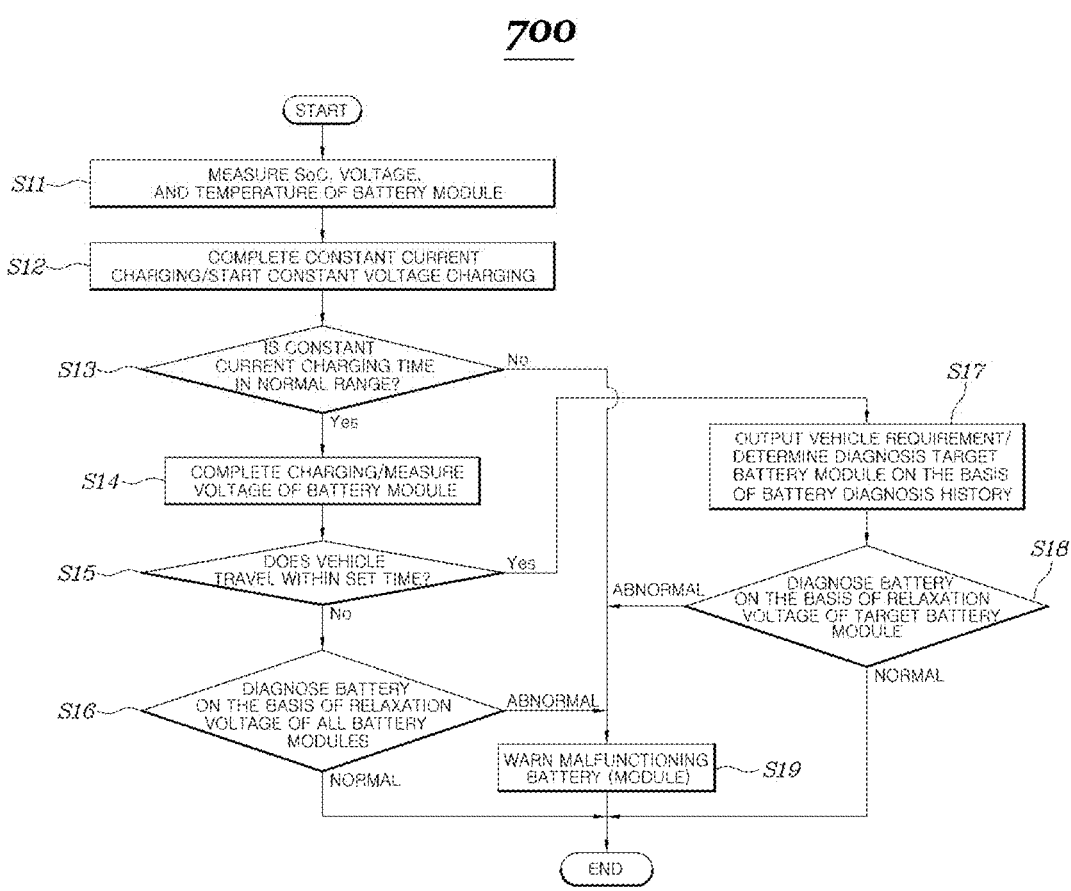
FIG. 7 is a flowchart illustrating the vehicle battery diagnosis system according to an embodiment of the present disclosure.

FIG. 7 is a flowchart 700 illustrating the vehicle battery diagnosis system according to an embodiment of the present disclosure.

Referring to FIG. 7, when the battery of the vehicle starts to be charged, the vehicle battery diagnosis system according to an embodiment of the present disclosure may measure the state of charge, the voltage, and the temperature of the battery modules in step S11. At step S11, the processor 11 may measure the state of charge, the voltage, and the temperature of the battery modules and store measurement information. The state of charge, the voltage, and the temperature of the battery modules are parameters to be used in determining whether or not the battery malfunctions on the basis of the constant current charging time applied in a situation constant current charging of the battery is completed.

At step S11, the processor 11 may measure the voltage and the temperature of the battery modules by collecting information detected by the voltage sensors and the temperature sensors provided in the battery modules. In addition, the processor 11 may be measure the state of charge of the battery modules by applying the battery-related parameters, such as the measured voltage and temperature of the battery modules, to a state of charge estimation algorithm. The processor 11 may select and determine an algorithm executed to measure the state of charge and parameters applied to the algorithm from a variety of methods well-known in the art.

A battery charging method performed in this case is constant current-constant voltage charging. As described above, the constant current-constant voltage charging is a method of charging the battery by supplying a constant current to the battery until the voltage of the battery reaches a predetermined voltage and, when the voltage of the battery is the predetermined voltage, charging the battery with a constant voltage.

When the constant current charging is completed and the constant voltage charging is started at step S12, the processor 11 may determine whether or not the battery malfunctions by comparing an actual constant current charging time with the constant current charging time stored in the constant current charging time table 131, on the basis of the state of charge, the voltage, and the temperature of the battery module stored at step S11.

More specifically, in step S13, the processor 11 may select a constant current charging time table corresponding to the previously-measured SoH of the battery and search the selected constant current charging time table for a constant current charging time set value corresponding to the actual constant current charging time measured in actual charging of the battery and the temperature of the battery. When the measured actual constant current charging time is greater or smaller than the constant current charging time set value read from the table 131 by a predetermined level, the processor 11 may determine the battery as malfunctioning. In this case, in step S19, the processor 11 may output a visual warning on a cluster of the vehicle or using a warning light of the vehicle or provide an audible warning by outputting an audible alarm or the like in order to notify that the battery malfunctions.

When the constant current charging time is determined to be within a normal range at step S13 and the battery is in a charging complete state in which the constant voltage charging is completed and no charging current is supplied to the battery, the processor 11 may start measuring the voltage of all the battery modules in the battery pack in step S14. At step S15, the voltage measurement performed at step S14 to measure the relaxation voltage of the battery modules may be continued for a predetermined time period when the discharging of the battery is not required for the traveling of the vehicle within the predetermined time period.

After the measurement of the relaxation voltage is performed on all the battery modules, the SoH (or lifetime) of the battery may be diagnosed on the basis of the relaxation voltage of all the battery modules at step S16.

More specifically, at step S16, the processor 11 may select an SoH table corresponding to the measured temperature of the battery and apply the relaxation voltage, i.e., the decrement of the battery voltage measured during the predetermined time period, and the constant current charging time to the selected SoH table, thereby estimating the SoH of the battery corresponding to the relaxation voltage and the constant current charging time to be the actual SoH of the battery.

In addition, when the difference in the SoH between the battery modules is greater than a predetermined reference value or the difference between a previously-estimated SoH and a currently-estimated SoH is greater than the predetermined reference value at step S16, the processor 11 may determine the corresponding battery module as malfunctioning and may provide a visual or audible warning to notify that the corresponding battery module malfunctions at step S19.

In addition, when the traveling of the vehicle is required before the passage of the predetermined time period after the charging in step S15, the processor 11 may determine at least one diagnosis target battery module to be diagnosed from the plurality of battery modules included in the battery back, on the basis of output power required for the vehicle, a battery diagnosis history, and the like in step S17.

More specifically, at step S15, the processor 11 may receive a required output for the traveling of the vehicle, input by a driver (e.g., by starting the vehicle or operating the accelerator pedal), and determine a battery module that may not be used during the supply of power to the batteries in response to the required power. That is, the battery module determined by the processor 11 to not be used in meeting the required output may be the diagnosis target battery module.

In addition, the processor 11 may determine a battery module having a relatively high SoH in previous diagnosis or having a history of diagnosis of malfunction to be the diagnosis target battery module.

That is, at step S17, the processor 11 may determine a battery module meeting both a condition of the required output and a condition of the history of diagnosis to be the diagnosis target battery module.

Subsequently, the processor 11 may select an SoH table corresponding to the battery temperature of the battery module determined to be diagnosed and apply the relaxation voltage, i.e., the decrement of the measured battery voltage reduced during the predetermined time period, and the actual constant current charging time to the selected SoH table, thereby estimating the SoH of the battery corresponding to the relaxation voltage and the actual constant current charging time to be the SoH of the diagnosis target battery module.

When the difference in the SoH between the battery modules diagnosed is greater than the predetermined reference value or the difference between a previously-estimated SoH and a currently-estimated SoH is greater than the predetermined reference value, the processor 11 may determine the corresponding battery module as malfunctioning and may provide a visual or audible warning to notify that the corresponding battery module malfunctions at step S19.

As set forth above, the vehicle battery diagnosis method and system according to embodiments of the present disclosure can accurately diagnose the SoH (or lifetime) of a battery or whether or not the battery malfunctions by measuring the relaxation voltage of the battery directly after the charging of the battery is completed.

Accordingly, the vehicle battery diagnosis method and system according to embodiments of the present disclosure can provide a customer or a manufacturer with accurate information regarding the customer service time or the possibility of a serious safety problem of the vehicle battery in order to remove or reduce customer inconvenience and prevent an accident.

Although the specific embodiments of the present disclosure have been described for illustrative purposes, those skilled in the art will appreciate that various modifications, additions, and substitutions are possible, without departing from the scope and spirit of the present disclosure as disclosed in the accompanying claims.

What is claimed is:

1. A vehicle battery diagnosis method comprising:

completing, by a controller, charging a battery by stopping a supply of current from a charger to the battery;

measuring, by the controller, a relaxation voltage, wherein the relaxation voltage is a voltage difference between a voltage of the battery at a completion of charging and a voltage of the battery after a predetermined time period from the completion of charging; and determining, by the controller, a state of health (SoH) of the battery based on the relaxation voltage and a duration of a constant current charging mode, wherein the charger operates in the constant current charging mode in which the charger charges the battery by supplying a charging current having a predetermined magnitude to the battery until the voltage of the battery reaches a predetermined reference value, and wherein, in the determining of the SoH of the battery, the SoH is determined by applying the duration of the constant current charging mode and the relaxation voltage to at least one SoH table in which an estimated SoH value corresponding to the duration of the constant current charging mode and the relaxation voltage are set in advance.

2. The method according to claim 1, wherein the charger operates in a constant voltage charging mode in which the charger charges the battery by applying a charging voltage having a predetermined magnitude to the battery when the voltage of the battery reaches a predetermined reference value in the constant current charging mode.

3. The method according to claim 2, further comprising: before completing the charging, determining, by the controller, whether the battery malfunctions in accordance with a time section in which the constant current charging mode is activated.

4. The method according to claim 3, wherein, in the determining whether the battery malfunctions, the battery is determined as malfunctioning when a difference between a reference constant current charging time corresponding to a temperature and a state of charge of the battery and a time section in which the constant current charging mode is activated is outside a predetermined range.

5. The method according to claim 3, wherein the determination of whether or not the battery malfunctions comprises:

determining a reference constant current time corresponding to an actually-measured temperature of the battery and a state of charge of the battery from a constant current charging time table in which a reference constant current charging time is set in advance to correspond to a temperature of the battery and the state of charge of the battery; and when a difference between the reference constant current time and a time in which the constant current charging mode is activated is outside a predetermined range, determining the battery as malfunctioning.

6. The method according to claim 5, wherein the constant current charging time table comprises a plurality of constant current charging time tables according to the SoH of the battery.

7. The method according to claim 1, wherein the at least one SoH table comprises a plurality of SoH tables according to the temperature of the battery.

8. The method according to claim 1, wherein, in the SoH table, the estimated SoH value is determined by linearly dividing a section between the relaxation voltage measured from a fresh sample of the battery and the relaxation voltage measured from an end-of-life (EOL) sample of the battery.

9. The method according to claim 8, wherein the EOL sample comprises a $90^{th}$ percentile battery selected from a group of samples comprising a plurality of EOL batteries.

10. A vehicle battery diagnosis system operating in a constant current charging mode to supply a charging current having a predetermined magnitude to a battery of a vehicle and in a constant voltage charging mode to provide a charging voltage having a predetermined magnitude to the battery when a voltage of the battery in the constant current charging mode reaches a predetermined reference value, the system comprising:

a memory comprising a constant current charging time table in which a reference constant current charging time corresponding to a temperature of the battery and a state of charge of the battery are set in advance and a state of health (SoH) table in which an estimated SoH value corresponding to a time section in which the constant current charging mode is activated and the relaxation voltage are set in advance; and a processor completing charging of the battery by stopping supply of current from a charger to the battery, measuring a relaxation voltage corresponding to a decrement of the voltage of the battery during a predetermined time period directly after the charging of the battery is completed, and diagnosing the battery by applying the temperature of the battery, the state of charge of the battery, the time section in which the constant current charging mode is activated, and the relaxation voltage to the constant current charging time table and the SoH table.

11. The system according to claim 10, wherein the processor determines a reference constant current time corresponding to a measured temperature of the battery and the state of charge of the battery from the constant current charging time table and, when a difference between the determined reference constant current time and a time in which the constant current charging mode is activated is out of a predetermined range, determines the battery as malfunctioning.

12. The system according to claim 10, wherein the constant current charging time table comprises a plurality of constant current charging time tables according to the SoH of the battery.

13. The system according to claim 10, wherein the processor determines the SoH of the battery by applying a measured time section in which the constant current charging mode is activated and an measured relaxation voltage to the SoH table.

14. The system according to claim 10, wherein the SoH table comprises a plurality of SoH tables according to the temperature of the battery.

15. The system according to claim 10, wherein the estimated SoH value is determined by linearly dividing a section between the relaxation voltage measured from a fresh sample of the battery and the relaxation voltage measured from an end-of-life (EOL) sample of the battery.

16. The system according to claim 15, wherein the EOL sample comprises a $90^{th}$ percentile battery selected from a group of samples comprising a plurality of EOL batteries.

17. A vehicle battery diagnosis system operating in a constant current charging mode to supply a charging current having a predetermined magnitude to a battery of a vehicle until a voltage of the battery reaches a predetermined reference value, the system comprising:

a controller configured to:

complete charging of the battery by stopping supply of current from a charger to the battery;

measure a relaxation voltage corresponding to a voltage difference between a voltage of the battery at completion of charging and a voltage of the battery after a predetermined time period from the completion of charging;

determine the state of state of health (SoH) of the battery, based on the relaxation voltage and the duration of a constant current charging mode, wherein the controller determines the SoH by applying the duration of the constant current charging mode and the relaxation voltage to at least one SoH table in which an estimated SoH value corresponding to the duration of the constant current charging mode and the relaxation voltage are set in advance.

* * * * *